United States Patent
Rankin, II et al.

(10) Patent No.: US 7,141,963 B1
(45) Date of Patent: Nov. 28, 2006

(54) HANDHELD SWITCH MEASUREMENT SYSTEM

(75) Inventors: James Rankin, II, Novi, MI (US); Paul Stewart, North Andover, MA (US); Pietro Buttolo, Dearborn Heights, MI (US); Anne Marsan, Ann Arbor, MI (US); Horea Ilies, Glastonbury, CT (US)

(73) Assignee: Ford Motor Company, Dearborn, MI (US)

( * ) Notice: Subject to any disclaimer, the term of this patent is extended or adjusted under 35 U.S.C. 154(b) by 0 days.

(21) Appl. No.: 11/255,249

(22) Filed: Oct. 21, 2005

(51) Int. Cl.
*G10R 11/32* (2006.01)

(52) U.S. Cl. .................................... 324/142
(58) Field of Classification Search ............... None
See application file for complete search history.

(56) References Cited

U.S. PATENT DOCUMENTS 6,621,275 B1 * 9/2003 Cotton et al. ............... 324/537
6,744,268 B1 * 6/2004 Hollman ..................... 324/758
6,900,641 B1  5/2005 Draggle et al.

* cited by examiner

*Primary Examiner*—Jermele Hollington
*Assistant Examiner*—Trung Q. Nguyen
(74) *Attorney, Agent, or Firm*—Gary A. Smith; MacMillian, Sobanski & Todd, LLC (57) ABSTRACT

A switch measurement system is disclosed for measuring characteristics of a switch while the switch is mounted to a product adjacent a product surface. The switch types may include linear, pivot and rotary types. The switch measurement system preferably has a control unit for driving a motor and receiving and storing input from a force or torque sensor. A fixturing setup preferably includes a mounting base, and three legs extending from the mounting base. Each of the legs is selectively adjustable in length and includes an end adapted for mounting against the product surface where the legs can vary the location and orientation of the mounting base relative to the product. Also, a measurement unit includes a motor fixed relative to the mounting base and includes a motor shaft extending therefrom, and a force sensor or a torque sensor, depending upon the switch measurement arrangement, interposed between the motor shaft and the switch. The motor and the sensor are in electronic communication with the control unit.

20 Claims, 5 Drawing Sheets

HANDHELD SWITCH MEASUREMENT SYSTEM

BACKGROUND OF INVENTION

The present invention relates to measuring human/mechanism interfaces, and more particularly to such measuring systems that relate to the measurement of relatively small one degree of freedom mechanisms, such as switches.

As the market for sales of products becomes more competitive, a manufacturer must distinguish its products from the competition. Thus, a product design may require more than providing the proper function—it may also require providing a certain feel or image for the product. For example, a small mechanism, such as a switch, may need to not only perform its function of adjusting the operation of a product, but also provide a certain feel to the switch operator while being actuated. Such a switch feel may give an impression of quality or distinctiveness to the product, and one may wish to have this particular feel for all of the switches on a given product. Thus, the feel of a switch may be almost as important as the function the switch performs. In order to define and achieve this feel, the human/machine interface for that particular switch must be defined and one must be able to test a switch to determine if it meets the desired definition. Consequently, an accurate and repeatable way to define and measure switches is needed.

Conventionally, measurements for determining characteristics of switches were accomplished by mounting the switches in laboratory type fixtures and connecting them to a switch measurement device. Typically, these measurement devices measured the peak force that was applied during switch actuation and possibly also the range of motion. Mostly, though, the feel of such switches is determined by consensus in panel studies. This conventional approach, however, does not produce a quantitative and repeatable means for completely defining the feel of a switch.

As a result, some of the more advanced systems will employ a laboratory type fixture with a more advanced measurement device that can measure the force applied to the switch as the switch moves through its range of motion. This force/displacement profile (or torque/displacement for a rotary switch), then, provides a more complete definition of the switch properties. And, since the fixtures are tailored to the switch being measured, the accuracy and repeatability can be high.

However, the laboratory type fixtures have drawbacks. This measurement will not take into account the effect of the switch being mounted in the actual product where it will be used—so the affect of the mount on the switch force/displacement characteristics is not taken into account. Thus, the switch, in service, may not have the same feel to an operator as was intended. Moreover, extra time must be taken to disassemble the switch from the product and mount it in the fixture. And, if one wishes to measure the switch after installation on the product at the factory, as a form of quality control, disassembling the switch from the product will defeat this purpose. This is particularly undesirable for measuring switches used in large products, such as vehicles. If one wishes to test switches after installation in a vehicle to make sure they meet their design specifications, then removing the switches for measurement would be very undesirable.

Some have attempted to develop small devices that can be used for such purposes, but they are simple, actuated by hand, and only measure force information, and no position or velocity date, during the switch actuation. But even these simple measurements can regularly have errors as high as thirty percent due to misalignment problems that are common and the non-repeatable nature of human powered actuation. Since, within or on the product, it can be very difficult or impractical to employ a laboratory type fixture that will assure very accurate alignment of the switch relative to the measuring apparatus, the misalignment of these small devices can regularly produce results with significant errors. This makes these small devices unsuitable for meeting the requirements of future products.

Thus, it is desirable to have a small portable switch measurement device that overcomes the drawbacks of prior portable devices, yet provides the complete and accurate results of more advanced laboratory type fixtures and measurement systems.

SUMMARY OF INVENTION

In its embodiments, the present invention contemplates a switch measurement system for measuring characteristics of a switch while the switch is mounted to a product adjacent a product surface. The system preferably includes a control unit; a fixturing setup including a mounting base, and at least three legs extending from the mounting base, with each of the at least three legs being selectively adjustable in length and including an end adapted for mounting against the product surface whereby the at least three adjustable legs can vary the location and orientation of the mounting base relative to the product; and a measurement unit including a motor fixed relative to the mounting base and including a motor shaft extending therefrom, and one of a force sensor and a torque sensor interposed between the motor shaft and the switch, and with the motor and the one of the force sensor and the torque sensor in electronic communication with the control unit.

An advantage of an embodiment of the present invention is that an accurate and repeatable force/displacement (or torque/displacement) profile can be measured for a switch without having to remove the switch from the product. This is particularly desirable for switches in large products, such as vehicles, where the measurement of the switches while still in the vehicle can provide a more true measurement of the switch feel as it would be for someone operating the switch during normal use of the product.

Another advantage of an embodiment of the present invention is that force/displacement profiles for a switch can be obtained more quickly and easily if the switch does not have to be disassembled from the product. Moreover, the measurement can be an accurate force profile over the entire range of the switch movement, rather than just an estimate of a peak force measurement. And, such measurements can include both static switch measurements and dynamic switch measurements.

A further advantage of an embodiment of the present invention is that switch measurement can be employed as a quality check at an assembly plant after the switch is installed in the product. This assures that the switches on the products are conforming to the design specifications.

An additional advantage of an embodiment of the present invention is that the on-product switch measurement allows one to obtain the force/displacement information without destroying the switch or the product.

DETAILED DESCRIPTION

A switch measurement system is disclosed that is particularly well suited for, but not limited to, switches mounted in vehicles. While the following description relates to the measurement of switches in vehicles, it can also be applied to other types of products.

Figure 1:
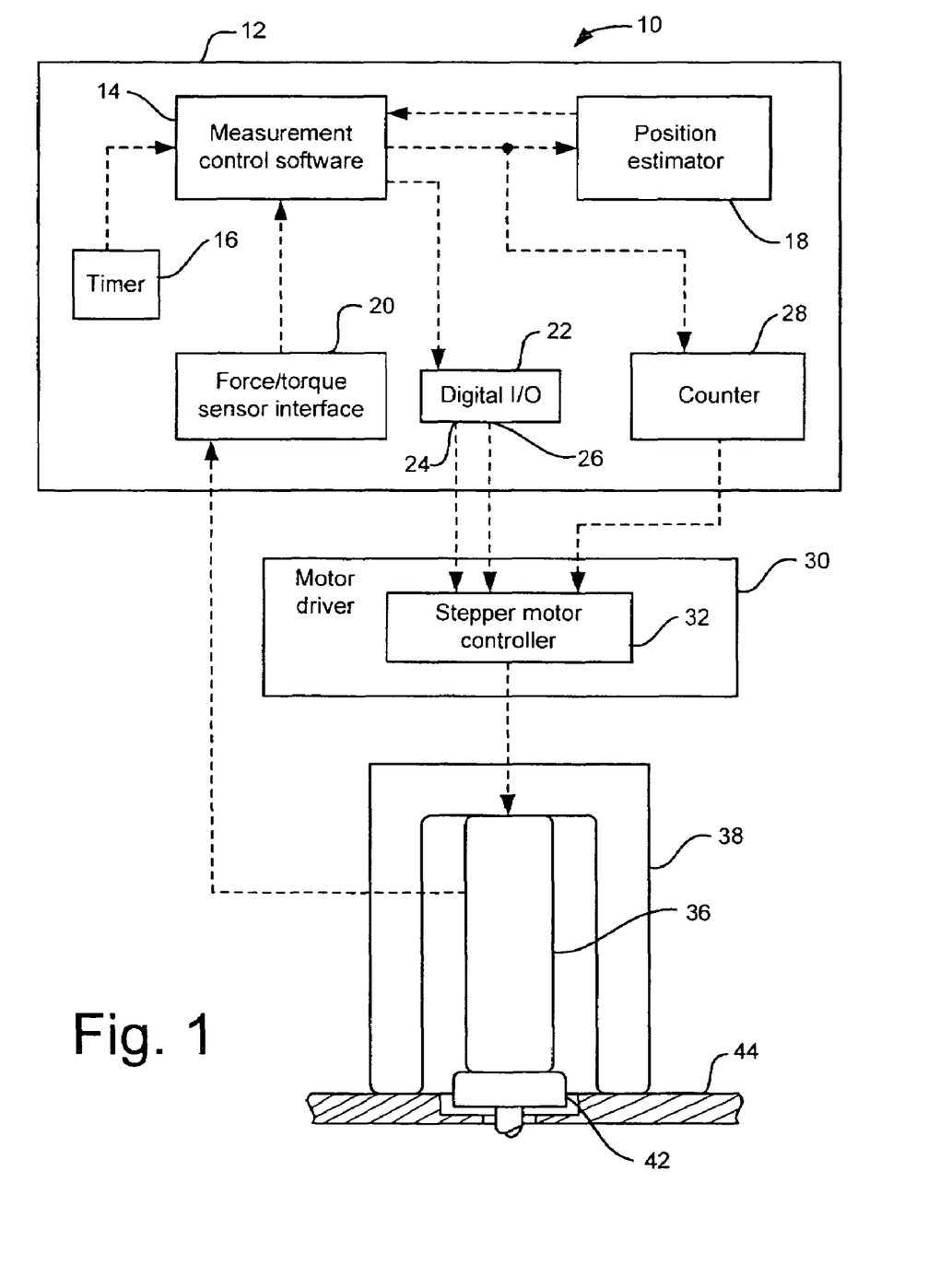
FIG. 1 is a schematic diagram of an overall switch measurement system in accordance with an embodiment of the present invention.
Figure 2:
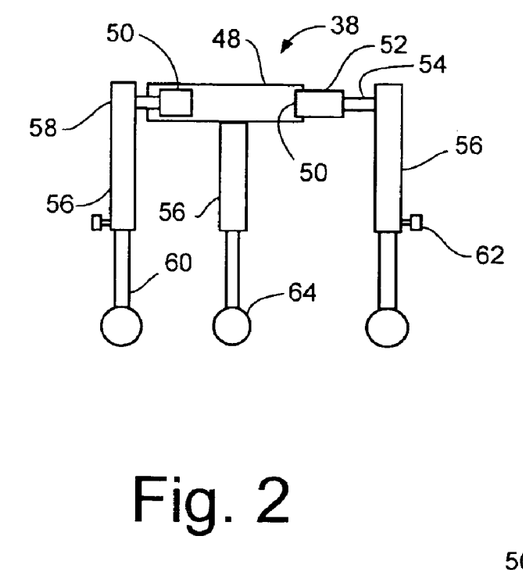
FIG. 2 is an elevation view of a fixture setup according to a first embodiment of the present invention.
Figure 3:
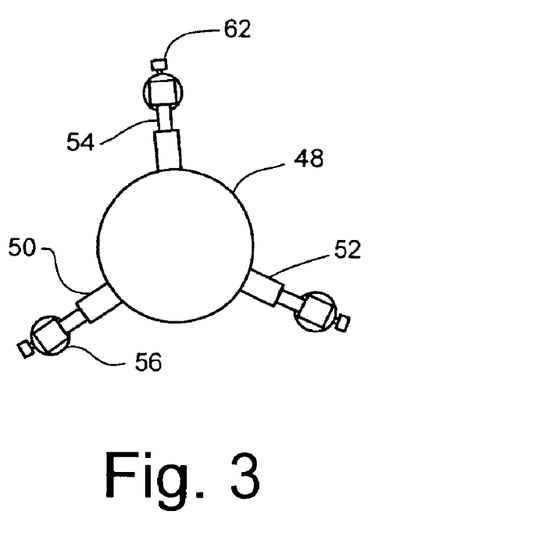
FIG. 3 is a plan view of the fixture setup of FIG. 2.

FIG. 1 illustrates a portion of a portable switch measuring system 10, which is optimally employed for measuring small one degree of freedom mechanisms, such as switches, while the mechanisms remain mounted to the products on which they will be employed. The switch measurement system 10 is, in effect, a type of physical impedance meter. That is, it can measure resistance to the motion of a mechanism as it travels along its predefined path, such as, for example, static friction, dynamic friction, inertia, weight, spring forces, and air pressure. These forces give the mechanism its feel characteristics as a human moves the mechanism along its path.

The portable switch measurement system 10 preferably includes a portable control unit 12, such as, for example, a general purpose laptop computer running a general purpose operating system, such as a MICROSOFT WINDOWS operating system, produced by Microsoft Corporation, of Redmond, Wash. The control unit can also be a special purpose computer, if so desired. The portable control unit 12 includes a graphical user interface to allow a user to see measured force/displacement (or torque/displacement) profiles. The dashed lines shown in FIG. 1 represent electrical connections between various system components.

In particular, the control unit 12 preferably includes measurement control software 14 that receives input from a timer 16. The measurement control software 14 will also preferably interface with position estimator software 18, and a force/torque sensor interface 20, (which may be on a separate interface card connected to the control unit 12). The measurement control software also preferably interfaces with a digital input/output (I/O) 22, which has an enable signal output 24 and a directional signal output 26. A counter algorithm 28 also preferably receives input from the measurement control software 14. The digital I/O 22 and counter 28 may be on separate interface cards connected to the control unit 12, if so desired. The software 14 may include the graphical user interface, as discussed above, a storage routing to record, organize and store force/displacement (or torque/displacement) profiles, an editor to edit the motion paths, and an output routine to provide output data that accurately describes the force/displacement profiles of a switch.

Electronically connected to the output from the control unit 12 is a motor driver 30, preferably including a stepper motor controller 32. The stepper motor controller 32 has inputs for receiving output from the counter 28 as well as the enable signal output 24 and direction signal output from the digital I/O 22. The computing system, software and motor controller discussed so far assumes that a stepper motor (discussed below)—whether linear or rotary—is employed. If one desires to employ a different type of motor, then the computing system, software and motor controller would, of course, be modified to interface with that type of motor. Although, a stepper motor is generally preferable since it can be easily controlled open loop.

The force/torque sensor interface 20 and the stepper motor controller 32 will electronically interface with a measurement unit 36 that is mounted to a fixturing setup 38. The measurement unit 36 will interface with a switch 42 that is being measured, while the fixturing setup 38 will interface with a product surface 44 in the vicinity of the switch 42. The measurement unit 36 and fixturing setup 38 are only illustrated generally in FIG. 1, in order to show how they fit into the overall setup; they are shown in greater detail in the embodiments of FIGS. 2–14 as discussed below.

FIGS. 2–6 illustrate a first embodiment of the fixturing setup 38 and measurement unit 36. The fixturing setup 38 includes a mounting base 48, from which three lateral legs 50 extend. Each of the lateral legs 50 is preferably formed from two shafts, a main shaft 52 affixed to the mounting base 48, and an extender shaft 54 that is telescopically received in and selectively extendable out of the main shaft 52. Connected to each lateral leg 50 is a longitudinal leg 56, which includes a main shaft 58 affixed to the lateral leg 50 and an extender shaft 60 that is telescopically received in and selectively extendable out of the main shaft 58. At the end of each extender shaft 60 is a generally spherical surface contact member 64. The spherical shape of each contact member 64 will allow for a single point of contact with the surface 44 for each longitudinal leg 56.

The number of longitudinal legs 56 is preferably three so that the fixturing setup 38 can be maintained against a product surface 44 without any tipping or rocking. Higher numbers of longitudinal legs may be employed, but this complicates the process of mounting and maintaining the fixturing setup 38 securely against the product surface 44.

Each longitudinal leg 56 also preferably includes a leg lock 62 that threads into the main shaft 58 and can screwed against the extender shaft 60 in order to hold the extender shaft 60 in place relative to the main shaft 58. While threaded leg locks 62 are illustrated, friction from interference fit, spring detent assemblies, or other conventional mechanisms for selectively holding one telescoping shaft relative to another may be employed, if so desired. Moreover, leg locks, friction from interference fit, spring detent assemblies, or other similar mechanisms may be employed to secure the extender shafts 54 of the lateral legs 50 relative to the main shafts 52.

The extender shafts 54 and 60 on each leg allow the mounting base 48 to be positioned and oriented properly relative to the switch 42 and maintained this way while the switch is being measured. This is true even if the product surface 44 around the switch 42 is uneven or if there are non-rigid surfaces, such as other switches, near the switch being measured. An example of such a product surface 44 is a vehicle instrument panel. The measurement unit 36 can then be secured to the mounting base 48, which will hold the unit 36 in the desired position and orientation. Thus, accurate and repeatable measurements of the switch can be assured.

Figure 4:
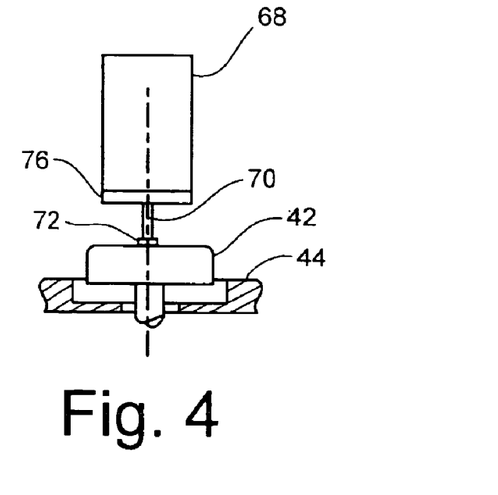
FIG. 4 is an elevation view of a measurement unit and a push button switch according to the first embodiment of the present invention.
Figure 5:
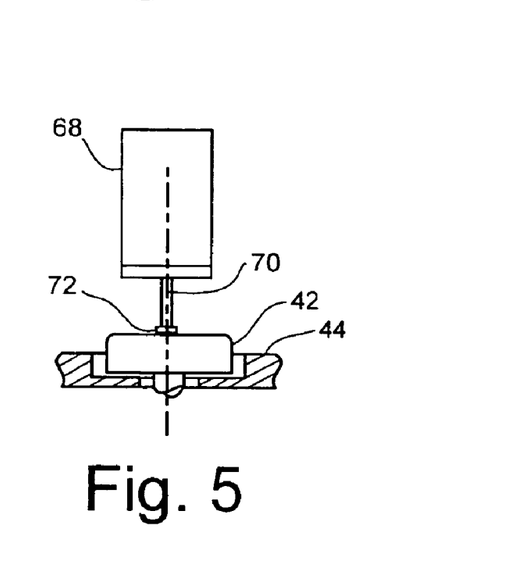
FIG. 5 is a view similar to FIG. 4, but illustrating a linear motor shaft in an extended position, causing the push button switch to be actuated.
Figure 6:
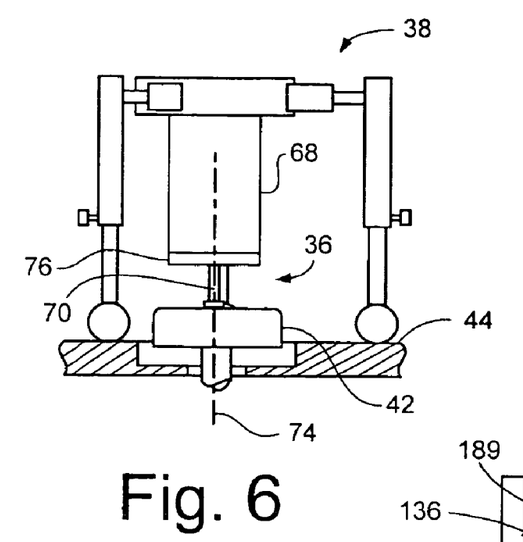
FIG. 6 is a view similar to FIGS. 1 and 4, illustrating the measurement unit mounted in the fixture setup.

The measurement unit 36 includes a linear stepper motor/encoder 68, which is securely mounted to the mounting base 48. The mounting may be by any conventional means desired, such as, for example, fasteners. The motor/encoder 68 is electrically connected to and driven by the stepper motor controller 32 (shown in FIG. 1). Extending from the motor/encoder 68 is a motor shaft 70, and on an end of the motor shaft 70 is a force sensor 72. The force sensor 72 is electrically connected and provides a force feedback signal to the force/torque sensor interface 20 (shown in FIG. 1). An optional mounting plate 76 may be mounted to the motor/encoder 68.

The preparation for taking a switch measurement includes mounting the measurement unit 36 to the mounting base 48 of the fixturing setup 38. The force sensor 72 is then aligned and placed in surface contact with the switch 42—preferably centered on an axis 74 of switch motion, with the motor shaft 70 extending and movable parallel to this axis 74. For a push button switch, the axis is generally centered on and extending normal to the surface of the switch. The extender shafts 54 for the lateral legs 50 are adjusted so that the surface contact members 64 will each align with a firm location on the product surface 44. Then, the extender shafts 60 for the longitudinal legs 56 are adjusted until each surface contact member 64 is in contact with the product surface 44, while maintaining proper location and orientation of the force sensor 72. As a result, the measurement unit 36 can be easily held in place while switch measurements are being taken. The control unit 12 (shown in FIG. 1) will cause the motor/encoder 68 to actuate the switch 42 over its path of travel while recording the force measurements. The motor/encode 68 can cause the switch 42 to move with various velocity profiles over its path, providing a number of force/displacement curves that can be used to define the switch 42.

Figure 7:
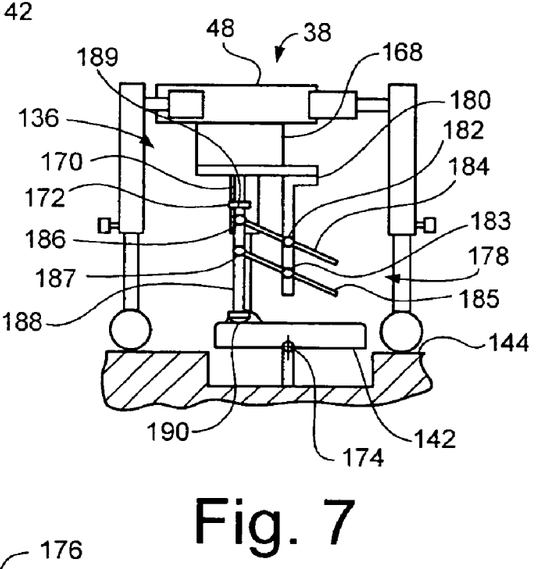
FIG. 7 is an elevation view of a measurement unit mounted in a fixture setup and positioned to actuate a switch according to a second embodiment of the present invention.
Figure 8:
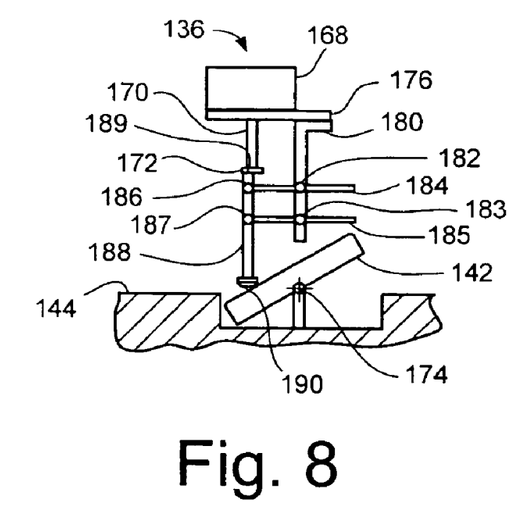
FIG. 8 is an elevation view of the measurement unit illustrating a linear motor shaft in an extended position, causing a switch to be actuated, according to the embodiment of FIG. 7, but not showing the fixture setup for clarity in showing the motion of a hinge assembly.

FIGS. 7 and 8 illustrate a second embodiment of the present invention. In this embodiment, the fixturing setup 38, as well as the overall measurement system 10 (shown in FIG. 1), is the same as in the first embodiment. The measurement unit 136 has changed in order to provide measurement capability for a pivot type switch 142.

Figure 13:
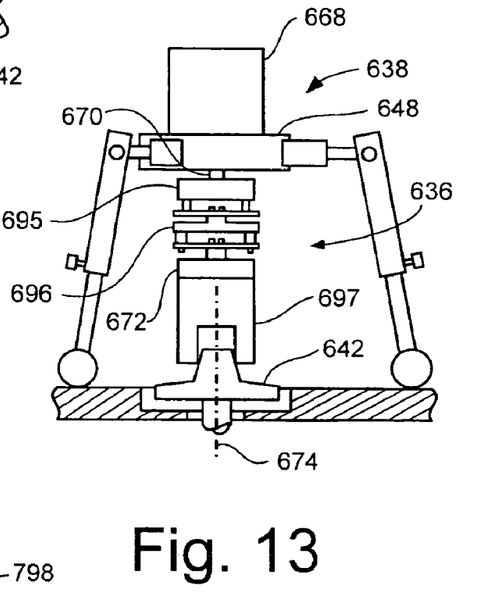
FIG. 13 is an elevation view similar to FIG. 6, but illustrating a seventh embodiment of the present invention.

Rather than measuring a linear switch where the linear motion of the motor shaft is aligned with the axis of motion for the switch, such as a push button switch, this embodiment is configured to measure a switch that pivots about an axis 174 that is not aligned with the linear motion of the motor shaft 170. Such a switch may be a rocker, a hinge or a push-pull type of switch. This type of switch is being distinguished herein from rotary switches (discussed below relative to the seventh embodiment as shown in FIG. 13) in that the pivot axis 174 is generally parallel to the product surface at the location of the switch and actuation is caused by a force acting generally normal to the product surface at the location of the switch. For the rotary type of switch illustrated in FIG. 13, the pivot axis is generally normal to the product surface at the location of the switch, with torque applied about this axis in order to actuate the switch.

The measurement unit 136 includes a linear stepper motor/encoder 168, which is securely mounted to the mounting base 48. The motor/encoder 168 is again electrically connected to and driven by the stepper motor controller 32 (shown in FIG. 1). Extending from the motor/encoder 168 is a motor shaft 170, and on an end of the motor shaft 170 is a force sensor 172. The force sensor 172 is electrically connected and provides a force feedback signal to the force/torque sensor interface 20 (shown in FIG. 1).

A mounting plate 176 is mounted to the motor encoder 168, with a hinge assembly 178 fixed thereto. The hinge assembly 178 includes a hinge support member 180 that mounts and can be adjusted relative to the mounting plate 176. The hinge support member 180 includes a first adjustable hinge point 182 and a second adjustable hinge point 183, with a first hinge axle 184 extending through the first adjustable hinge point 182 and a second hinge axle 185 extending through the second adjustable hinge point 183. The first hinge axle 184 also engages a first probe hinge 186 on a probe 188, and the second hinge axle 185 also engages a second probe hinge 187 on the probe 188. The first adjustable hinge point 182 is spaced from the second adjustable hinge point 183 about the same distance as the first probe hinge 186 is spaced from the second probe hinge 187. This spacing means that the first hinge axle 184 extends generally parallel to the second hinge axle 185.

The probe 188 includes a first end 189 that is contacted and driven by the force sensor 172, and a second end that forms a probe tip 190. The probe tip 190 is preferably rounded where it makes contact with the switch 142—either being semicircular or semispherical.

The preparation for taking a switch measurement includes mounting the measurement unit 136 to the mounting base 48 of the fixturing setup 38. The force sensor 172 is then aligned and placed in surface contact with the first end 189 of the probe 188, with the probe 188 aligned with and extending generally parallel to the motor shaft 170. The probe tip 190 is placed in surface contact with the switch 42 at a location where a switch operator would contact the switch when actuating it. The hinge axles 184 and 185 are then adjusted in their respective adjustable hinge points 182 and 183 until the hinge support member 180 is oriented to extend generally parallel to the probe 188 and is located such that an imaginary line extending through the two adjustable hinge points 182 and 183 also passes through the axis 174. One will note that the adjustable hinge points 182 and 183, in combination with the hinge axles 184 and 185, allow this measurement unit 136 to take accurate force measurements for different size pivot switches.

The extender shafts 54 for the lateral legs 50 are adjusted so that the surface contact members 64 will each align with a firm location on the product surface 144. Then, the extender shafts 60 for the longitudinal legs 56 are adjusted until each surface contact member 64 is in contact with the product surface 144, while maintaining proper location and orientation of the probe 188. The leg locks 62 are then tightened. As a result, the measurement unit 136 can be easily held in place while switch measurements are being taken.

The control unit 12 (shown in FIG. 1) will cause the motor/encoder 168 to move the motor shaft 170 linearly outward from the motor/encoder 168. The motor shaft 170 will, in turn, push on the probe 188. Since the probe 188 is constrained by the probe hinges 186 and 187, it will cause the probe tip 190 to move along an arcuate path as it actuates the switch 142 over its path of travel. As the switch 142 moves over its path of travel (that is, its displacement), the force readings are taken by the force sensor 170 and received by the force/torque sensor interface 20 (shown in FIG. 1). The accuracy is assured because not only does the hinge assembly 178 cause the probe tip 190 to move in an arcuate path, but also causes the rounded probe tip 190 to maintain contact with essentially the same point on the switch 142 throughout this path of travel.

Again, as with the first embodiment, the motor/encode 168 can cause the switch 142 to move with various velocity profiles over its path, providing a number of force/displacement curves—both static and dynamic—that can be used to define the properties of the switch 142.

One will also note that, with this second embodiment of the switch measurement system, one can reorient the fixturing setup 38, and hence the measurement unit 136, to match an angle at which a switch operator would likely push on the switch. This assures that the measured force/displacement profile accurately matches the actual human/switch interface. It is the significant amount of adjustability of these assemblies, in mutiple degrees of freedom, that readily allows for such adjustments.

Figure 9:
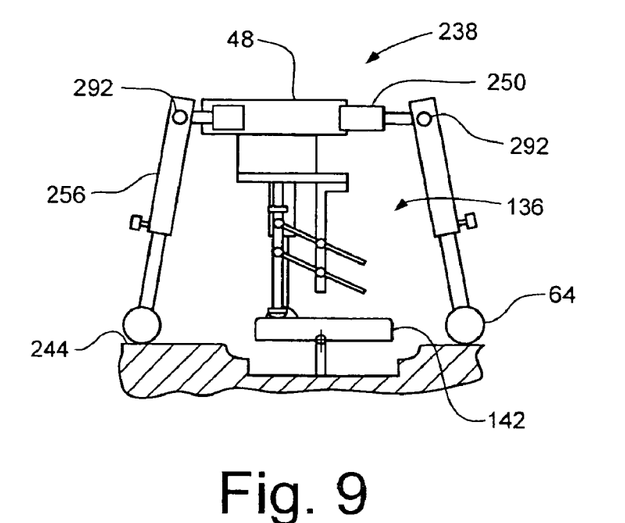
FIG. 9 is an elevation view similar to FIG. 7, but illustrating a third embodiment of the present invention.

FIG. 9 illustrates a third embodiment of the present invention. In this embodiment, the measurement unit 136 and switch 142 are the same as in the second embodiment, although the measurement units and switches of the other embodiments shown herein may also be employed with the feature of this embodiment. The fixturing setup 238 still includes the same mounting base 48, but each lateral leg 250 is now connected to its corresponding longitudinal leg 256 via a leg hinge 292. The three leg hinges 292 allow for more flexibility in determining the best locations on the product surface 244 for the surface contact members 64. While the leg hinges 292 are only shown in the embodiments of FIGS. 9 and 13, they may be employed with any of the embodiments shown herein.

Figure 10:
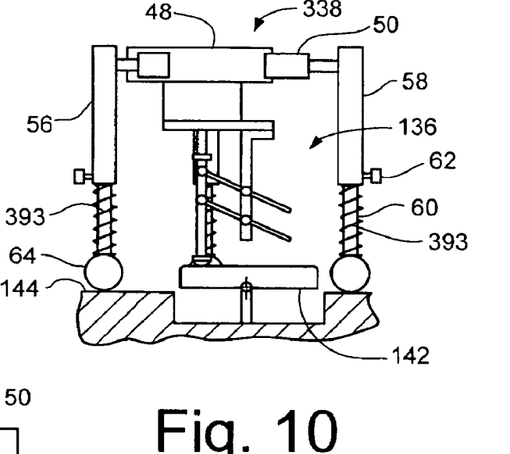
FIG. 10 is an elevation view similar to FIG. 7, but illustrating a fourth embodiment of the present invention.

FIG. 10 illustrates a fourth embodiment of the present invention. In this embodiment, the measurement unit 136 and switch 142 are the same as in the second embodiment, although the measurement units and switches of the other embodiments shown herein may also be employed with the feature of this embodiment. The fixturing setup 338 still includes the same mounting base 48 and legs 50 and 56, but the extension shaft 60 of each longitudinal leg 56 now includes a leg spring 393. Each of the three leg springs 393 is compressed between its main shaft 58 and corresponding surface contact member 64. Thus, while the fixturing setup 338 is being located for a switch measurement, the leg springs 393 will push the surface contact members 64 into contact with the product surface 144. The leg springs 393 can have a relatively low spring constant since they are only used for assisting with the leg extension during alignment of the fixturing setup 338. Once aligned, the leg locks 62 can be engaged to maintain the proper leg extension. While the leg springs 393 are only shown with the embodiments of FIGS. 10–12, they may be employed with any of the other embodiments shown herein.

Figure 11:
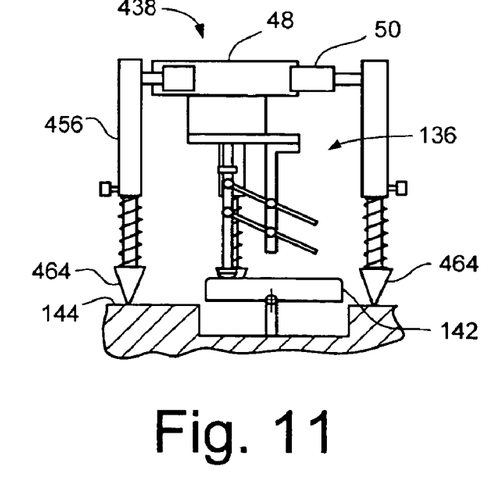
FIG. 11 is an elevation view similar to FIG. 7, but illustrating a fifth embodiment of the present invention.

FIG. 11 illustrates a fifth embodiment of the present invention. In this embodiment, the measurement unit 136 and the switch 142 are the same as in the second embodiment, although the measurement units and switches of the other embodiments shown herein may also be employed with the feature of this embodiment. The fixturing setup 438 still includes the same mounting base 48 and lateral legs 50, but the longitudinal legs 456 each now include a conical shaped surface contact member 464. The conical shape of the three surface contact members 464 still provides point contact with the product surface 144, as is the case with the spherical surface contact members, but are narrower adjacent to the points of contact in order to limit potential interference from other features in the product surface 144. While the conical surface contact members 464 are only shown with the embodiment of FIG. 11, they may be employed with any of the other embodiments shown herein.

Figure 12:
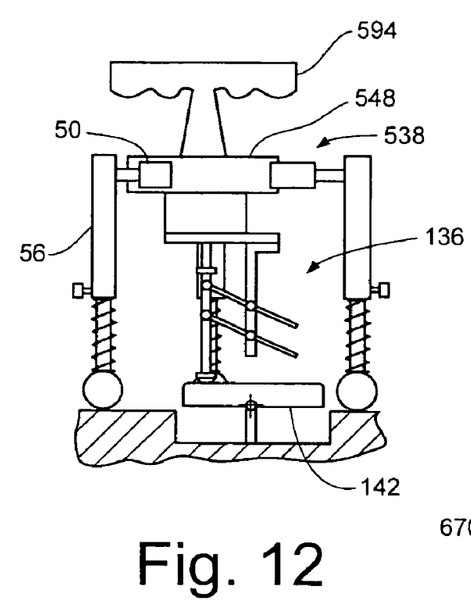
FIG. 12 is an elevation view similar to FIG. 7, but illustrating a sixth embodiment of the present invention.

FIG. 12 illustrates a sixth embodiment of the present invention. In this embodiment, the measurement unit 136 and the switch 142 are the same as in the second embodiment, although the measurement units and switches of the other embodiments shown herein may also be employed with the feature of this embodiment. The fixturing setup 538 includes the same legs 50 and 56, but there is now a handle 594 mounted to the mounting base 548. The handle 594 may help the operator to hold the fixturing setup 538 in place, both when initially aligning the assembly and later when taking switch measurements. While the handle 594 is only shown with the embodiment of FIG. 11, it may be employed with any of the other embodiments shown herein. Moreover, the shape of the handle 594 is only exemplary, and it may have other shapes, as desired by the operator of this system.

FIG. 13 illustrates a seventh embodiment of the present invention. In this embodiment, the fixturing setup 638 and the measurement unit 636 are configured for measuring torque/displacement curves for a rotary switch 642. The rotary switch 642 has an axis 674 about which it rotates. Since this is a rotary switch 642, a rotary—rather than linear—stepper motor/encoder 668 is employed. This allows for the rotational movement of the motor shaft 670 to be centered with and rotate about the axis 674, thus assuring accurate measurements of the torque values. The motor/encoder 668 is electrically connected to and driven by the stepper motor controller 32 (shown in FIG. 1).

The fixturing setup 638 is very similar to the other embodiments except that the mounting base 648 is adapted to mount the rotary stepper motor/encoder 668 on top, with the motor shaft 670 extending therethrough. Although, if so desired, the rotary stepper motor/encoder 668 may be mounted underneath the mounting base 648—this may require longer longitudunal legs or a shorter motor/encoder height, but will operate in the same manner. One advantage of the motor/encoder 668 being mounted on top of the mounting base 648 is that it can be used as a convenient handle by the operator while aligning over and taking measurements of the rotary switch 642.

For this measurement unit 636, a gear reducer 695 is preferably connected to and rotationally driven by the motor shaft 670. A Naugler coupling 696 then connects to and is driven by the gear reducer 695. The Naugler coupling 696 has the ability to couple shafts together while compensating for angular, lateral and axial misalignment, and while providing essentially zero backlash and constant angular velocity between the shafts. Without such a coupling, any misalignment of the measurement unit 636 relative to the switch 642 would result in errors in the measured torque. The Naugler coupling 696 then connects to and drives a torque sensor 672, which is, in turn, connected to an end effector 697. The end effector 697 engages the switch 642. The end effector 697 can be any suitable shape, as desired, so long as it will engage and rotate the switch 642 when driven by the other components of the measurement unit 636. The force sensor 672 is electrically connected and provides a torque feedback signal to the force/torque sensor interface 20 (shown in FIG. 1).

The preparation for taking a switch measurement is similar to the previous embodiments, except that the end effector 697 is aligned with the rotary switch 642 as the fixturing setup 638 is being located and oriented.

Figure 14:
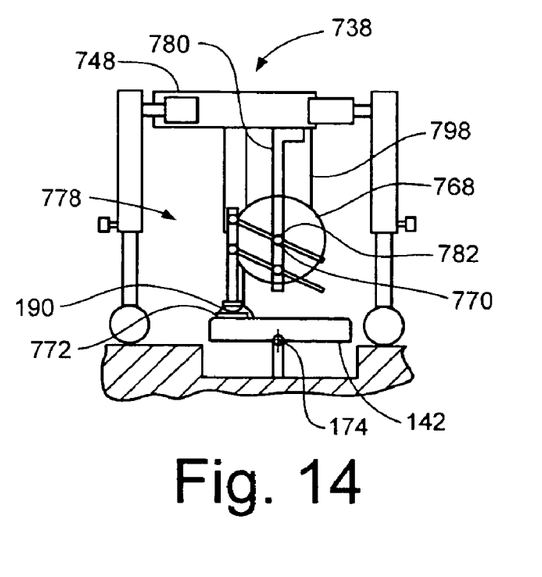
FIG. 14 is an elevation view similar to FIG. 7, but illustrating an eighth embodiment of the present invention.

FIG. 14 illustrates an eighth embodiment of the present invention. In this embodiment, the fixturing setup 738 and switch 142 are essentially the same as in the second embodiment. The significant difference is that this embodiment employs a rotary stepper motor/encoder 768 for measuring a pivot type switch 142, rather than a linear stepper motor/encoder.

The rotary motor/encoder 768 is secured to the mounting base 748 via a mounting bracket 798. The motor/encoder 768 is oriented so that the motor shaft 770 is generally parallel to the axis 174, and is located so that the motor shaft 770 connects to the first adjustable hinge point 782. The hinge support member 780 is mounted to the mounting base 748. Although, if so desired, the mounting bracket 798 can be configured so that the hinge support member 780 mounts to it instead. The rest of the hinge assembly 778 is essentially the same as in the second embodiment.

A force sensor 772 is mounted between the probe tip 190 and the switch 142, for feeding a signal back to the force/torque sensor interface 20 (shown in FIG. 1). The preparation for taking a switch measurement is very similar to that of the second embodiment, with the significant difference being that the force sensor 772 needs to be mounted properly during this preparation process.

One will note from reviewing the above noted embodiments that, while the architecture for the hand held switch measurement devices and the portable fixturing setup used to quickly and accurately mount and align the measurement units is the essentially the same for different types of switches, such as linear, pivot and rotary, the different types of motion require modified measurement units to compensate for the different switch motion. Consequently, relatively quick and easy modifications to the measurement unit will allow one to switch from measuring one type of switch to another while still assuring accurate and repeatable switch measurement results.

The specific examples of a portable switch measuring system discussed herein have been directed to switches, but this system is, of course, applicable to measuring and creating force/displacement and torque displacement profiles for other types of small one degree of freedom mechanisms.

While certain embodiments of the present invention have been described in detail, those familiar with the art to which this invention relates will recognize various alternative designs and embodiments for practicing the invention as defined by the following claims.

What is claimed is:

1. A switch measurement system for measuring characteristics of a switch while the switch is mounted to a product adjacent to a product surface, the system comprising:
a control unit;
a fixturing setup including a mounting base, and at least three legs extending from the mounting base, with each of the at least three legs being selectively adjustable in length and including an end adapted for mounting against the product surface whereby the at least three adjustable legs can vary the location and orientation of the mounting base relative to the product; and
a measurement unit including a motor fixed relative to the mounting base and including a motor shaft extending therefrom, and one of a force sensor and a torque sensor interposed between the motor shaft and the switch, and with the motor and the one of the force sensor and the torque sensor in electronic communication with the control unit.

2. The switch measurement system of claim 1 wherein the at least three legs each include a lateral leg connected to the mounting base and extending in a direction generally parallel to the product surface and a longitudinal leg connected to the lateral leg and extending in a direction generally normal to the product surface.

3. The switch measurement system of claim 2 wherein at least one of the lateral legs includes a main shaft portion and an extender shaft portion received in and telescopically slidable relative to the main shaft portion.

4. The switch measurement system of claim 2 wherein at least one of the longitudinal legs includes a main shaft portion and an extender shaft portion received in and telescopically slidable relative to the main shaft portion.

5. The switch measurement system of claim 4 wherein the at least one of the longitudinal legs that includes the main shaft portion and the extender shaft portion also includes a surface contact member mounted to the extender shaft portion, and a spring mounted about the extender shaft that extends between the main shaft portion and the surface contact member.

6. The switch measurement system of claim 2 wherein each of the longitudinal legs includes a respective one of a plurality of surface contact members.

7. The switch measurement system of claim 6 wherein each of the plurality of surface contact members is generally spherically shaped.

8. The switch measurement system of claim 6 wherein each of the plurality of surface contact members is generally conically shaped.

9. The switch measurement system of claim 1 further including a handle mounted to the mounting base.

10. The switch measurement system of claim 1 wherein the switch has a linear path of motion with a linear axis of motion extending along the linear path of motion, and the motor is a linear motor and the fixturing setup is adapted to mount to the product surface such that the motor shaft extends along the linear axis of motion.

11. The switch measurement system of claim 1 wherein the switch has a pivot axis of motion and a path of motion centered about the pivot axis of motion; the motor is a linear motor; and the measurement unit includes a probe having a first end in engagement with the motor shaft, a second end adapted to be in engagement with the switch, a first probe hinge, and a second probe hinge spaced a predetermined distance from the first probe hinge, a hinge support member that is selectively fixable relative to the motor and includes a first hinge point and a second hinge point spaced from the first hinge point about the predetermined distance, a first hinge axle extending between and operatively engaging the first probe hinge and the first hinge point, and a second hinge axle extending between and operatively engaging the second probe hinge and the second hinge point.

12. The switch measurement system of claim 11 wherein the hinge support member is locatable relative to the motor such that an imaginary line extending through the first hinge point and the second hinge point is adapted to intersect with the pivot axis of motion.

13. The switch measurement system of claim 12 wherein the first hinge axle is movable relative to the first hinge point and the second hinge axle is movable relative to the second hinge point such that the second end of the probe is adapted to be in engagement with a desired contact location on the switch.

14. The switch measurement system of claim 11 wherein the second end of the probe has a curved shape adapted to be in contact with the switch.

15. The switch measurement system of claim 1 wherein the switch has a pivot axis of motion and a path of motion centered about the pivot axis of motion; the motor is a rotary motor; and the measurement unit includes a probe having a probe tip adapted to be in engagement with the switch, a first probe hinge, and a second probe hinge spaced a predetermined distance from the first probe hinge, a hinge support member that is selectively fixable relative to the motor and includes a first hinge point and a second hinge point spaced from the first hinge point about the predetermined distance, a first hinge axle extending between and operatively engaging the first probe hinge and the first hinge point, and a second hinge axle extending between and operatively engaging the second probe hinge and the second hinge point, and with the motor shaft operatively engaging the first hinge point.

16. The switch measurement system of claim 1 wherein the switch has a rotary axis of motion and a rotational path of motion centered about the rotary axis of motion; the motor is a rotary motor; and the measurement unit includes a Naugler coupling rotationally coupled to the motor shaft, and an end effector rotationally coupled to the Naugler coupling and adapted to engage the switch.

17. The switch measurement system of claim 16 wherein the measurement unit further includes a gear reductor interposed between the Naugler coupling and the motor shaft, and the one of the force sensor and the torque sensor is a torque sensor that is interposed between the Naugler coupling and the end effector.

18. The switch measurement system of claim 1 wherein the at least three legs each include a lateral leg connected to the mounting base and extending in a direction generally parallel to the product surface and a longitudinal leg connected to the lateral leg and extending in a direction generally normal to the product surface, and wherein at least one of the at least three legs includes leg hinge hingedly connecting the lateral leg of the at least one of the at least three legs to the longitudinal leg of the at least one of the at least three legs.

19. A switch measurement system for measuring characteristics of a switch while the switch is mounted to a product adjacent to a product surface, with the switch having a pivot axis of motion and a path of motion centered about the pivot axis of motion, the system comprising:

a fixturing setup including a mounting base, and at least three legs extending from the mounting base, with each of the at least three legs being selectively adjustable in length and including an end adapted for mounting against the product surface whereby the at least three adjustable legs can vary the location and orientation of the mounting base relative to the product; and a measurement unit including a linear motor fixed relative to the mounting base and including a motor shaft extending therefrom, a force sensor interposed between the motor shaft and the switch, a probe having a first end in engagement with the motor shaft, a second end adapted to be in engagement with the switch, a first probe hinge, and a second probe hinge spaced a predetermined distance from the first probe hinge, a hinge support member that is selectively fixable relative to the motor and includes a first hinge point and a second hinge point spaced from the first hinge point about the predetermined distance, a first hinge axle extending between and operatively engaging the first probe hinge and the first hinge point, and a second hinge axle extending between and operatively engaging the second probe hinge and the second hinge point.

20. A switch measurement system for measuring characteristics of a switch while the switch is mounted to a product adjacent to a product surface, with the switch having a rotary axis of motion and a rotational path of motion centered about the rotary axis of motion, the system comprising:

a fixturing setup including a mounting base, and at least three legs extending from the mounting base, with each of the at least three legs being selectively adjustable in length and including an end adapted for mounting against the product surface whereby the at least three adjustable legs can vary the location and orientation of the mounting base relative to the product; and a measurement unit including a rotary motor fixed relative to the mounting base and including a motor shaft extending therefrom, a torque sensor interposed between the motor shaft and the switch, a Naugler coupling rotationally coupled to the motor shaft, and an end effector rotationally coupled to the Naugler coupling and adapted to engage the switch.

* * * * *